(12) United States Patent
Langen et al.

(10) Patent No.: US 6,328,846 B1
(45) Date of Patent: Dec. 11, 2001

(54) DEVICE FOR AN ETCH TREATMENT OF A DISK-LIKE OBJECT

(75) Inventors: Kurt Langen, Villach (AT); Philip Engesser, Lindau (DE)

(73) Assignee: SEZ Semiconductor-Equipment Zubehör für die Halbleiterfertigung AG (AT)

( * ) Notice: Subject to any disclaimer, the term of this patent is extended or adjusted under 35 U.S.C. 154(b) by 0 days.

(21) Appl. No.: 09/484,873

(22) Filed: Jan. 18, 2000

(30) Foreign Application Priority Data

Jan. 15, 1999 (DE) ................................................ 199 01 291

(51) Int. Cl.⁷ .................................................. H01L 21/00
(52) U.S. Cl. .......................................... 156/345; 118/728
(58) Field of Search ........................ 156/345; 118/723 E, 118/728

(56) References Cited

U.S. PATENT DOCUMENTS 6,113,702 * 9/2000 Halpin et al. ......................... 118/728

* cited by examiner

*Primary Examiner*—Thi Dang
(74) *Attorney, Agent, or Firm*—R W Becker & Associates; R. W. Becker

(57) ABSTRACT

The invention concerns a device for an etch treatment of a disk-like object, in particular a wafer, having a means for receiving the disk-like object without contact and at least two guiding elements disposed normally to the means and limiting the position of the disk-like object at its periphery.

7 Claims, 1 Drawing Sheet

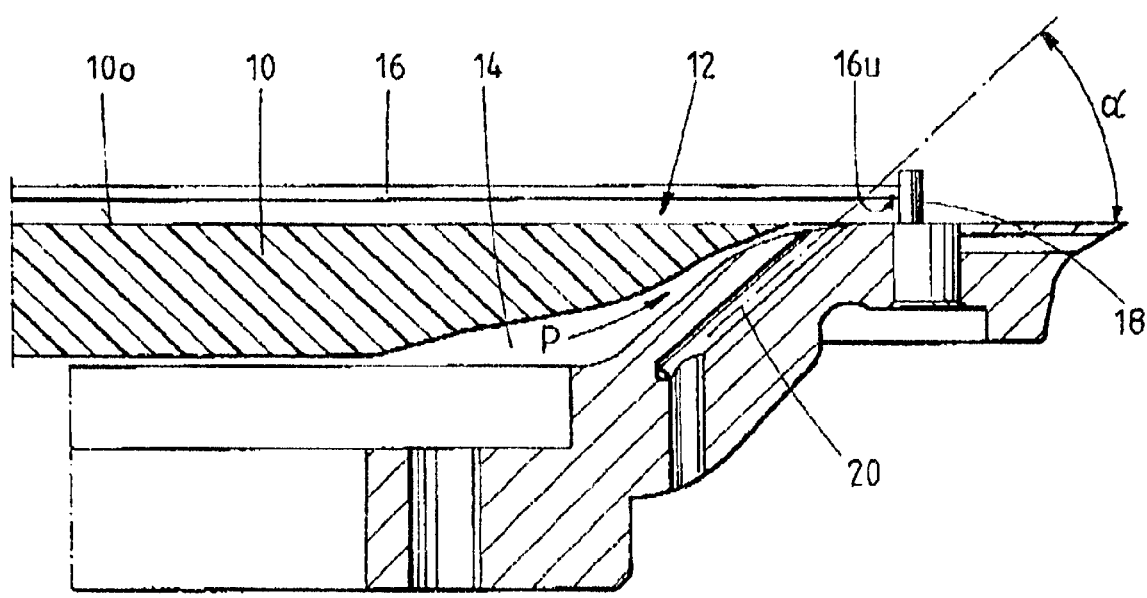

DEVICE FOR AN ETCH TREATMENT OF A DISK-LIKE OBJECT

The invention concerns a device for an etch treatment of a disk-like object, in particular a wafer, having a means for receiving the disk-like object without contact and at least two guiding elements disposed perpendicular to the means and limiting the position of the disk-like object at its periphery.

For example, such a device is known from the EP 0 611 274 A1.

Here, the wafer is positioned without contact (on an air cushion) on an associated support of the means and is rotated during treatment. In principle, such devices for wafer treatment, functioning according to the Bernoulli principle have proven their worth. The "resting" of the wafer on the means without contact prevents that the lower surface facing the means is damaged during treatment.

At most, the wafer contacts lateral guiding elements (often also called pins) being carried excentrically according to the EP 0 611 274 A1.

It was found, especially in the etch treatment, that etching fluid may run to the lower surface in the edge region, that is in particular in the region of said pins. The result is that the lower surface of the wafer, too, has etched portions in the region of the pins, so-called pin marks.

This problem is mentioned and solved in the JP 9-107023 A in that individual pins are gradually removed (withdrawn) from the wafer edge for some time during wafer treatment. However, such a means requires a considerable installation with respect to equipment and control technique and, moreover, it has the disadvantage that more pins than are actually needed for guiding the wafer laterally have to be provided, so that the wafer still remains in its exact position even if one or two pins are withdrawn.

In this respect, the object of the invention is to solve the problem mentioned in the published Japanese application and mentioned above in an alternative way. In particular, the point is to avoid the etched areas observed on the lower surface in the region of the lateral guiding elements.

In that the invention starts out from the consideration to prevent by a specific (additional) gas flow that the etching fluid or other treating medium reaches the lower side of the wafer via the wafer edge, that is specifically in the region of the guiding elements for the wafer.

Then the invention in its most general embodiment proposes a device of the type mentioned in the beginning, wherein at least one nozzle means is associated with each guiding element, through which a gaseous treating medium may be fed against the lower surface of the disk-like object, directly adjacent the respective guiding element.

In other words, each guiding element has associated a separate nozzle, through which a pressurized gas is jetted to the region of the associated guiding element from below. In this way, the treating fluid is blown away before it may reach the regions not to be etched on the lower surface of the wafer, and an undesirable treatment of the lower surface of the wafer is prevented.

The effectiveness of the nozzle means may be increased, if it is adjusted in such a manner that the associated gaseous treating medium washes around the associated guiding element, at least on the inner side. In this embodiment, the outlet end of the nozzle means extends below the wafer and preferable at an angle >1 and <90° with respect to the plane of the wafer. Here, angles between 10 and 60° have been found to be favourable.

The inclined air jet ensures that possible fluid is blown away radially to the outside before it may reach the lower surface of the wafer in that region via the wafer edge.

An embodiment provides that each nozzle means has at least one gas supply channel which is disposed within an imaginary surface portion enclosed by the guiding elements.

Here, the surface extending inside the nozzle means, which serves for guiding the wafer without contact, is defined as the support in a device functioning according to the Bernoulli principle.

The shape of the nozzle means, especially the shape of the cross section of an associated gas channel, depends in particular on the constructive design of the guiding elements (pins). In cylindrical pins the gas supply channel will have a circular cross section or have a slit shape and the cross-sectional area will be dimensioned in such a manner that a jet may be directed additionally and two-dimensionally at least to the region of the lower surface of the wafer adjacent the guiding element. Splitting the gas supply channels into individual part channels is also possible.

Each nozzle means may be disposed outside and at a distance from a region across which a gas cushion is formed between the support and the disk-like object according to the Bernoulli principle It was found in preliminary tests that the portion of gaseous treating medium supplied through the nozzle means should be at least 10% of the total quantity of the gaseous treating medium flowing against the lower surface of the disk-like object. The total quantity also includes the gas portion being necessary for guiding the wafer on the device without contact and at a distance.

With respect to the geometry and the number of guiding elements the device according to the invention is not subject to limitations. Thus, it is sufficient in principle to provide two guiding elements which correspondingly have the form of a segment of a circle, for example. Here, a certain line or surface contact with the edge of the wafers occurs inevitably, which may be reduced, if cylindrical guiding elements (pins) are used, for example, at least three of which have to be provided then.

In every case, the guiding elements—as known from the EP 0 611 274 A—may again be positioned at least in two different positions with respect to the disk-like object.

In the device according to the invention any "underetching" in the region of the guiding elements is prevented by the nozzle means mentioned above. No additional expenditure of control technique is required by that, because the same treating medium may be used for regulating the Bernoulli effect (for guiding the wafer).

The teaching according to the invention is formed in such a manner that known devices, too, for example according to the EP 0 611 274 A1, may be retrofitted according to the invention. For that it is only necessary to provide additional bores in the region of the pins (guiding elements), through which the pressurized gas is jetted against the pins and the adjacent lower surface of the wafer. That pressure may be higher than the gas pressure for guiding the wafer without contact.

The invention is described in more detail below with an embodiment which shows—schematically—a partial section through a device according to the invention.

Here, a support 10 can be seen as a component of a means 12 having an annular nozzle 14, through which a gas is jetted in the direction of the arrow P. In this way, it is ensured that a wafer 16 disposed on the support 10 (means 12) is guided securely at a distance from the support surface 10o, the actual "guiding" being effected through lateral pins 18 projecting from the seat 12. The pins are guided excentrically and contact the associated edge of the wafer 16 in the operational position in a point or line, respectively.

A gas supply channel 20 is disposed in the seat 12 adjacent the nozzle 14, which extends at an angle α of about 45° with respect to the support surface 10o and is adjusted in such a manner that a gas supplied through the channel 20 is jetted against an associated pin 18 and the adjacent portion of the lower surface 16u of the wafer 16, respectively. In other words, the central longitudinal axis of the channel 20 and the pin 18 are in one plane. In this manner it is prevented reliably that etching fluid might reach the surface portion 16u of the wafer 16 and undesirable etchings (so-called pin marks) are effected.

In the illustrated embodiment, the portion of gas flowing through the channel 20 is about 2 units of volume per minute, whereas the portion of gas flowing through the nozzle 14 comprises about 8 units of volume per minute.

What is claimed is:

1. A device for an etch treatment of a disk-like object (16), comprising
   means (12) for receiving the disk-like object (16) without contact;
   at least two guiding elements (18) disposed normally to said means (12) and limiting the position of the disk-like object (16) at its periphery;
   at least one nozzle means (20) associated with each said at least two guiding elements (18), wherein each nozzle means (20) is adjusted at an angle >1 and <90° with respect to the plane of the disk-like object (16); a gaseous treating medium led through each said at least one nozzle means (20) and against a lower surface (16u) of the disk-like object (16) directly adjacent the respective guiding element (18).

2. The device according to claim 1, wherein each nozzle means (20) comprises a gas supply channel extending within an imaginary surface portion enclosed by the guiding elements (18).

3. The device according to claim 1, wherein each nozzle means (20) is adjusted at an angle >10 and <60° with respect to the plane of the disk-like object (16).

4. The device according to claim 1, wherein a gas cushion is formed in a region between the means (12) and the disk-like object (16) according to the Bernoulli principle, and wherein each said nozzle means (20) is disposed outside of and at a distance from said region.

5. The device according to claim 1, wherein each nozzle means (20) is adjusted in such a manner that the associated gaseous treating medium washes around the associated guiding element (18), at least on the inner side.

6. The device according to claim 1, wherein the portion of gaseous treating medium supplied through the nozzle means (20) is at least 10% of the total quantity of the gaseous treating medium flowing against the lower surface of the disk-like object (16).

7. The device according to claim 1, wherein each guiding element (18) may be positioned at least in two different positions with respect to the disk-like object (16).

* * * * *